United States Patent
Sugino et al.

(10) Patent No.: US 6,656,819 B1
(45) Date of Patent: *Dec. 2, 2003

(54) PROCESS FOR PRODUCING SEMICONDUCTOR DEVICE

(75) Inventors: Takashi Sugino, Kawaguchi (JP); Hideo Senoo, Kawaguchi (JP)

(73) Assignee: Lintec Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/723,083

(22) Filed: Nov. 27, 2000

(30) Foreign Application Priority Data

Nov. 30, 1999 (JP) .......................... 11/340334

(51) Int. Cl.$^7$ .......................... H01L 21/301
(52) U.S. Cl. .......................... 438/460
(58) Field of Search .................. 438/460, 464, 438/114, 110, 113, 118, 119; 29/423, 413, 846

(56) References Cited

U.S. PATENT DOCUMENTS

| | | | |
|---|---|---|---|
| 4,722,130 A | * 2/1988 | Kimura et al. | 29/413 |
| 5,110,388 A | 5/1992 | Komiyama et al. | 156/229 |
| 5,118,567 A | 6/1992 | Komiyama et al. | 428/345 |
| 5,762,744 A | * 6/1998 | Shibata et al. | 156/235 |
| 5,888,883 A | * 3/1999 | Sasaki et al. | 438/460 |
| 6,558,975 B2 | * 5/2003 | Sugino et al. | 438/459 |

FOREIGN PATENT DOCUMENTS

| | | | | |
|---|---|---|---|---|
| EP | 0775715 | 5/1997 | | |
| EP | 0981156 | 2/2000 | | |
| EP | 1 026 735 A2 | 8/2000 | | |
| JP | 63148655 A | * 6/1988 | ........... | H01L/21/78 |
| JP | 63164336 A | * 7/1988 | ........... | H01L/21/78 |
| JP | 2-032181 | 3/1990 | | |
| JP | 05335411 | 6/1993 | | |
| JP | 8-053655 | 2/1996 | | |
| JP | 8-239639 | 9/1996 | | |
| JP | 9-067558 | 3/1997 | | |
| JP | 9-100450 | 4/1997 | | |
| JP | 9-202872 | 8/1997 | | |
| JP | 09-213662 A | 8/1997 | | |
| JP | 0231602 | 8/1998 | | |
| JP | 11-305673 A | 5/2001 | | |
| WO | WO 99/25019 | * 5/1999 | ........... | H01L/21/77 |

OTHER PUBLICATIONS

Patent Abstract of Japan, JP 2000–195826 A, Abstract, Jul. 14, 2000, Toshiba KK.

* cited by examiner

*Primary Examiner*—W. David Coleman
*Assistant Examiner*—Brook Kebede
(74) *Attorney, Agent, or Firm*—Webb Ziesenheim Logsdon Orkin & Hanson P.C.

(57) ABSTRACT

A process for producing a semiconductor device, including the steps of forming grooves of a cut depth smaller than the thickness of a wafer; sticking a surface protective sheet onto the wafer surface; grinding the back of the wafer to divide the wafer into individual chips; adhering a dicing/die bond sheet onto the back of the wafer; peeling the surface protective sheet from the wafer surface to thereby expose the adhesive layer of the dicing/die bond sheet through each space between individual chips; cutting the dicing/die bond sheet; detaching the individual chips from the base of the dicing/die bond sheet; and bonding the individual chips through the adhesive layer of the dicing/die bond sheet to a given substrate.

1 Claim, 3 Drawing Sheets

PROCESS FOR PRODUCING
SEMICONDUCTOR DEVICE

CROSS-REFERENCE TO RELATED APPLICATION

This application is related to co-pending, commonly owned U.S. patent application Ser. No. 09/943,488, filed Aug. 30, 2001, now U.S. Pat. No. 6,558,975 granted May 6, 2003.

FIELD OF THE INVENTION

The present invention relates to a process for producing a semiconductor device. More particularly, the present invention is concerned with a process for producing a semiconductor device in which an appropriate amount of adhesive layer can easily be formed on the back of extremely thin chips to thereby enable avoiding chip breakage, chip cracking or package cracking, so that a productivity enhancement can be realized.

BACKGROUND OF THE INVENTION

In recent years, the spread of IC cards has been promoted, and further reduction of the thickness there-of is now demanded. Accordingly, it is now required that the thickness of semiconductor chips, which has been about 350 $\mu$m, be reduced to 50–100 $\mu$m or less.

Thin semiconductor chips can be obtained by first adhering a surface protective tape for back grinding to a circuit surface of a wafer, subsequently grinding the wafer back and thereafter dicing the wafer. When the thickness of the wafer after the grinding is extremely small, chip breakage and chip cracking are likely to occur at the time of the dicing of the wafer.

As another means for attaining the reduction of the chip thickness, Japanese Patent Laid-open Publication No. 5(1993)-335411 discloses a process for producing semiconductor chips, in which grooves of given depth are formed from a wafer surface and thereafter the back of the wafer is ground. Further, this publication discloses a method in which, after the step of grinding the wafer back, pellets adhering to a mounting tape are detached from the mounting tape and fixed to a lead frame.

The chips obtained by this process are extremely thin and are likely to be broken in the subsequent mounting step.

When it is intended to pick up semiconductor chips adhered to a mounting tape and fix the picked semiconductor chips onto a substrate, it is common practice to employ the method known as the "dispenser method" or the method in which a film adhesive is used.

In the dispenser method, a given amount of liquid adhesive is applied to sites of a substrate predetermined for fixing semiconductor chips with the use of a dispenser, followed by press-bonding/fixing of semiconductor chips thereonto. However, this disperser method has drawbacks in that controlling the discharge amount of adhesive is difficult to thereby cause the adhesive amount to fluctuate, bringing about a variation of quality, and in addition a bleeding phenomenon occurs because the adhesive is liquid. When bleeding of the adhesive occurs, the adhesive may curl up to the upper surface of the chips, or the semiconductor chips may be inclined, so that failure is likely to occur at the time of wire bonding. Moreover, when packages, after resin sealing, are placed in high-temperature conditions, package cracking may be caused by volatile components which evaporate from any bled adhesive.

In the method in which a film adhesive is used, a film adhesive cut into substantially the same shape as that of the chip is stuck to sites of a substrate predetermined for fixing semiconductor chips in advance, or a film adhesive cut into substantially the same shape as that of the chip is adhered to chips, and the chips are fixed through the film adhesive to the substrate. However, in this method, it is required to cut the film adhesive into substantially the same shape as that of the chip in advance, so that practicing the method is time-consuming. Further, the work for adhering the film adhesive of the same extremely small size as that of the chip is requisite, so that the method is very laborious.

Even if any of the above means is employed, minute chips which have been ground to an extremely small thickness to thereby become very brittle are handled, so that chip breakage is likely to result from slight misoperation.

Therefore, there is a demand for the development of a method of easily and securely forming an adhesive layer on, especially, the back of chips.

The present invention has been made in view of the above state of the prior art. In order to overcome the problems of the prior art, to overcome the problems of the prior art, the present invention to provides a process, for producing a semiconductor device in which an appropriate amount of adhesive layer can easily be formed on the back of extremely thin chips to thereby enable avoiding chip breakage, chip cracking or package cracking, so that a productivity enhancement can be realized.

SUMMARY OF THE INVENTION

The process for producing a semiconductor device according to the present invention comprises the steps of:
  providing a wafer of given thickness having a surface furnished with semiconductor circuits and a back;
  forming grooves of a cut depth smaller than the thickness of the wafer, the grooves extending from the wafer circuit surface;
  sticking a surface protective sheet onto the wafer circuit surface;
  grinding the back of the wafer so that the thickness of the wafer is reduced to thereby finally result in division of the wafer into individual chips with spaces therebetween;
  sticking a dicing/die bond sheet onto the ground back of the wafer, the dicing/die bond sheet comprising a base and, superimposed thereon, an adhesive layer, the adhering performed so that the adhesive layer is brought into contact with the ground back of the wafer;
  peeling the surface protective sheet from the wafer circuit surface to thereby cause the adhesive layer of the dicing/die bond sheet to be exposed through each space between neighboring individual chips;
  cutting the exposed adhesive layer of the dicing/die bond sheet;
  detaching the individual chips having the cut adhesive layer adhering thereto from the base of the dicing/die bond sheet; and
  bonding the individual chips through the adhesive layer to a given substrate.

This process of the present invention enables efficiently performing the production of a device.

DETAILED DESCRIPTION OF THE INVENTION

The present invention will be described in detail below with reference to the appended drawings.

Figure 1:
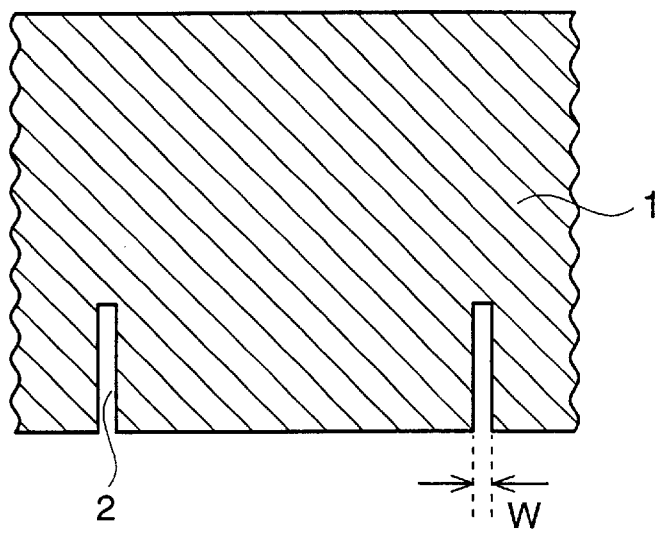
FIGS. 1 to 6 are cross-sectional side views which show the steps of the process for producing a semiconductor device according to the present invention.

First Step: Referring to FIG. 1, wafer 1 of a given thickness having a surface furnished with semiconductor circuits and a back is provided, and grooves 2 of a cut depth smaller than the thickness of the wafer 1 are formed, which grooves extend from the wafer circuit surface. For example, grooves 2 of given depth extending from the surface of the wafer 1 are formed by cutting work along cut positions of the wafer 1 for partitioning a plurality of semiconductor circuits from each other.

The formation of grooves 2 by cutting work is performed with the use of conventional wafer dicing machine wherein the cut depth is appropriately regulated. At the cutting work, according to necessity, the wafer 1 may be fixed by means of, for example, a dicing tape commonly employed at the time of wafer dicing. The thickness of the wafer 1, although not particularly limited, is generally in the range of about 350 to 800 $\mu$m. The depth of the grooves 2 is appropriately determined in conformity with the thickness of the desired chips, which is generally in the range of about 20 to 500 $\mu$m. On the other hand, the width W of the grooves 2 is equal to the width of employed dicing blade, which is generally in the range of about 10 to 100 $\mu$m.

Figure 2:
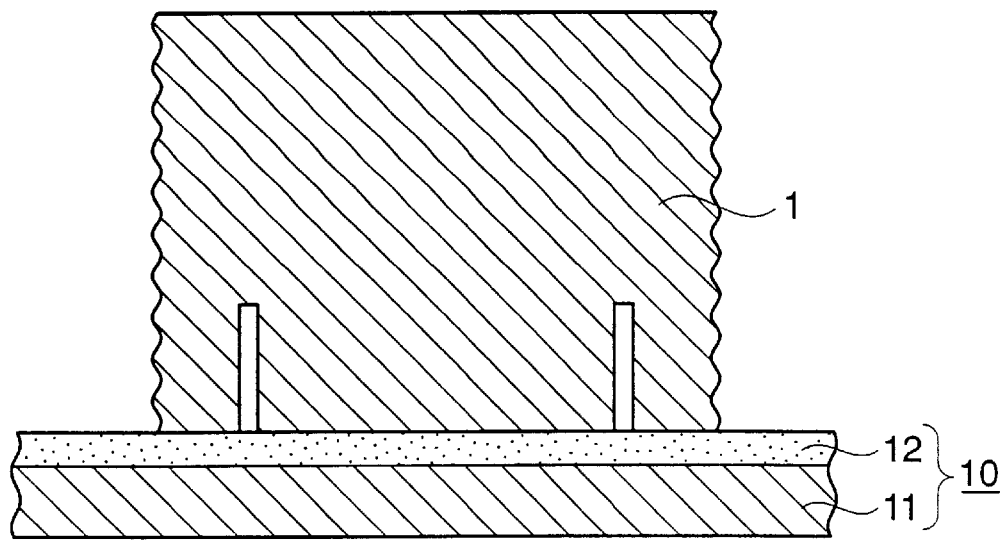

Second Step: Referring to FIG. 2, surface protective sheet 10 is stuck to the circuit surface of the wafer 1. Specifically, the adhering of the surface protective sheet 10 is performed so as to cover the entire circuit surface of the wafer 1.

The surface protective sheet 10 comprises base 11 and, superimposed thereon, removable adhesive layer 12. The adhesive layer 12 has the property of being easily removed after an intended use. The removable adhesive layer 12 may be composed of an adhesive which is curable by energy radiation (energy rays or energy beams). The energy radiation curable adhesive has the property of being capable of fixing an adherend with satisfactory adhesive strength before exposure to energy radiation but being curable by exposure to energy radiation to thereby lose the adhesive strength and hence enable easy peeling.

Various protective sheets having commonly been employed for, for example, the protection of a variety of items and the processing of semiconductor wafer can be used as the above surface protective sheet 10. In particular, the surface protective sheets proposed by the applicants in Japanese Patent Application Nos. 10(1998)-231602 and 11(1999)-305673 are preferably employed in the present invention.

Figure 3:
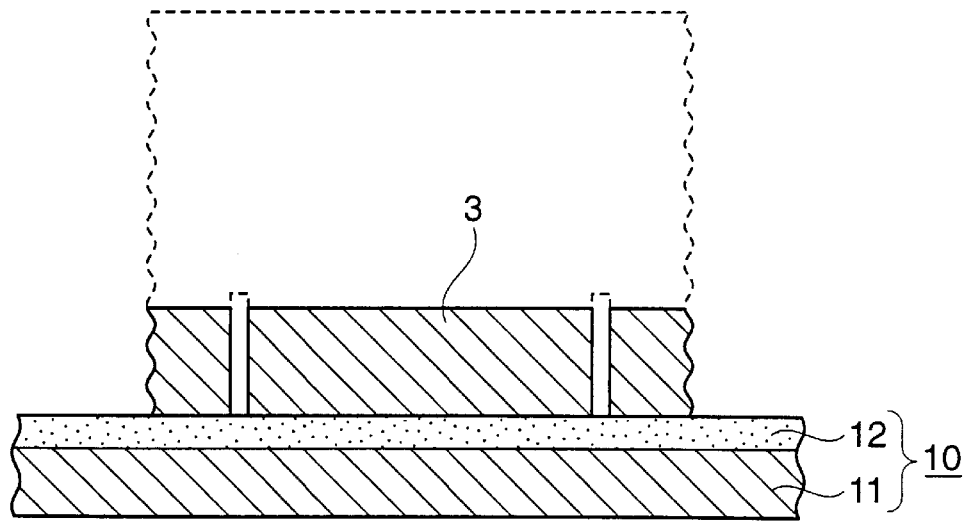

Third Step: Referring to FIG. 3, the back of the semiconductor wafer 1 is ground so that the thickness of the semiconductor wafer 1 is reduced to thereby finally result in division of the semiconductor wafer 1 into individual chips 3 with spaces therebetween. Specifically, the bottoms of the grooves 2 are removed, and the grinding of the wafer 1 is continued until given thickness of the wafer 1 to thereby effect the division into individual chips 3. The grinding of the wafer back is performed by means of conventional back grinding machine.

Figure 4:
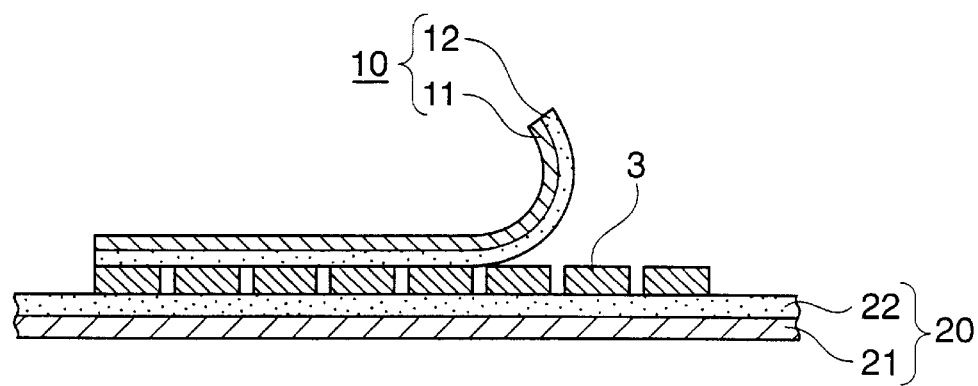

Fourth Step: Referring to FIG. 4, dicing/die bond sheet 20 is stuck onto the ground back of the wafer 1, the individual chip and the surface protective sheet 10 is peeled off the circuit surface of the chips.

The dicing/die bond sheet 20 comprises base 21 and, superimposed thereon, adhesive layer 22. The adhesive layer 22 is so formed as to be peelable from the base 21. The adhesive layer 22 adheres to the chips 3 at room temperature or under mild thermo-press bonding conditions. When the chips 3 are picked up after the application of the adhesive layer 22 to the chips 3, the adhesive layer 22 remains adhering to the back of the chips 3 and is peeled from the base 21.

Various sheets having commonly been employed in the dicing and die bonding of semiconductor wafers are used without any particular limitation as the above dicing/die bond sheet 20.

For example, use can be made of:

dicing/die bond sheets including an adhesive layer containing an energy radiation curable pressure sensitive adhesive component and a thermosetting adhesive component as essential components, as described in, for example, Japanese Patent Laid-open Publication Nos. 2(1990)-32181, 8(1996)-53655, 8(1996)-239639, 9(1997)-100450 and 9(1997)-202872, and dicing/die bond sheets including an adhesive layer composed of a polyimide resin and a nitrogen-containing organic compound compatible therewith, as described in Japanese Patent Laid-open Publication No. 9(1997)-67558.

Furthermore, appropriate use can be made of dicing/die bond sheets including an adhesive layer composed of any of an epoxy resin, an imide resin, an amide resin, a silicone resin, an acrylate resin, products of modification of these and mixtures thereof.

After the sticking of the above dicing/die bond sheet 20 to the ground back of the wafer 1, the surface protective sheet 10 is peeled from the wafer 1. When the adhesive layer of the surface protective sheet 10 is composed of an energy radiation curable adhesive, the adhesive strength of the adhesive layer is lowered by exposure to energy radiation before the peeling of the sheet 10.

Figure 5:
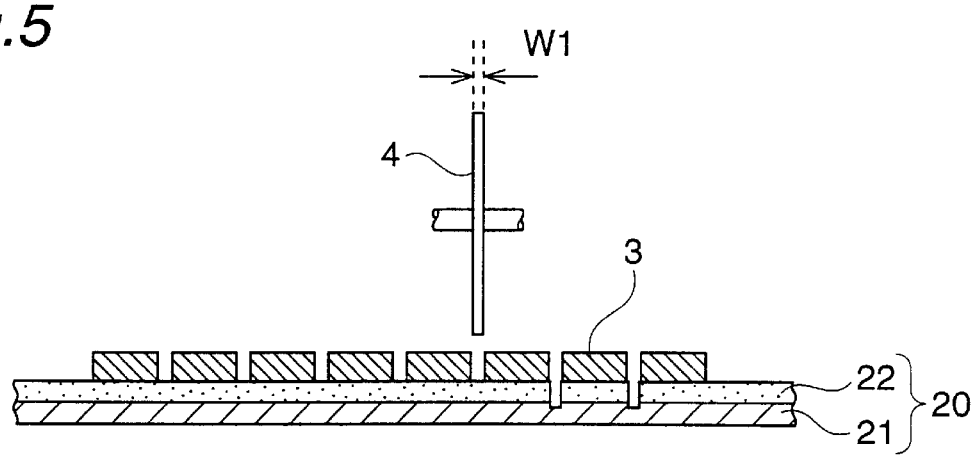

Fifth Step: Referring to FIG. 5, the adhesive layer of dicing/die bond sheet 20 exposed through each space between neighboring individual chips are cut.

The peeling of the surface protective sheet 10 from the wafer circuit surface causes the adhesive layer 22 of the dicing/die bond sheet 20 to be exposed through each space between neighboring individual chips divided by the cutting. The adhesive layer 22 is fully cut down to the base layer 21 by means of dicing blade 4. The width W1 of the dicing blade 4 is slightly smaller than the aforementioned width W of the grooves 2. For example, it is preferred that the width W1 be about 30 to 90% of the width W.

Although the depth of cut is satisfactory as long as the adhesive layer 22 can be fully cut, it is generally preferred that the cutting be performed to such an extent that the base 21 is partially cut to thereby complete the splitting of the adhesive layer 22 into pieces. As a result, the adhesive layer 22 is cut into pieces of substantially the same size and shape as those of the chips 3.

Figure 6:
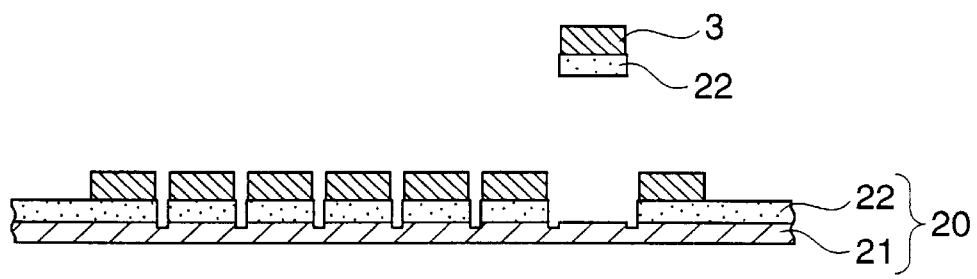

Sixth Step: Referring to FIG. 6, the adhesive layer 22 together with the chips 3 is detached from the base 21 of the dicing/die bond sheet 20. The adhesive layer 22, as aforementioned, is so formed as to be detachable from the base 21. Accordingly, when the chips 3 are picked up after the application of the adhesive layer 22 to the chips 3, the adhesive layer 22 remains adhered to the back of the chips 3 and is peeled from the base 21.

When the adhesive layer 22 is composed of the aforementioned adhesive containing an energy radiation curable pressure sensitive adhesive component and a thermosetting adhesive component as essential components, it is preferred that the adhesive layer 22 be exposed to energy radiation before picking up of the chips 3. In this instance, the exposure to energy radiation decreases the adhesive strength of the adhesive layer 22, so that the peeling of the adhesive layer 22 from the base 21 can effectively be accomplished. The exposure to energy radiation may be performed prior to the above fifth step.

Seventh Step: The individual chips 3 are bonded through the adhesive layer 22 to a given substrate (not shown). The back of the chips 3 is furnished with the adhesive layer 22 in the above step 6. The chips 3 can be secured onto a substrate by disposing the chips 3 through the adhesive layer 22 on the substrate and by causing the adhesive layer 22 to exert its adhesive strength by required means.

When the adhesive layer 22 is composed of the aforementioned adhesive containing an energy radiation curable pressure sensitive adhesive component and a thermosetting adhesive component as essential components, the bonding capability of the thermosetting adhesive component can be exerted by heating to thereby enable strongly bonding the chips 3 and the substrate to each other. When the adhesive layer 22 is composed of a polyimide resin and a nitrogen-containing organic compound compatible therewith, also, the polyimide resin can be cured by heating to thereby enable strongly bonding the chips 3 and the substrate to each other.

Moreover, the adhesive layer 22 is a solid adhesive of substantially the same shape as that of the chips 3, so that problems such as bleeding would not occur to thereby enable reducing the occurrence of wire bonding failure, package cracking, etc.

As apparent from the foregoing, the process for producing a semiconductor device according to the present invention enables easily forming an appropriate amount of adhesive layer on the back of extremely thin chips to thereby enable avoiding chip breakage, chip cracking or package cracking, so that a productivity enhancement can be realized.

EXAMPLES

The present invention will further be illustrated below with reference to the following Examples which in no way limit the scope of the invention.

Hereinbelow, the "(a) chipping test", "(b) wire bonding test" and "(c) package crack test" were performed in the following manner.

"(a) Chipping test"

Sides of each of 50 silicon chips furnished with adhesive layers, produced in the following Examples and Comparative Examples, were observed through an optical microscope with respect to chip breakage and presence of cracking, and, in the event of cracking, the crack width was measured.

"(b) Wire bonding test"

With respect to 100 semiconductor devices produced in the following Examples and Comparative Examples, the wire bonding property between an aluminum pad on an upper surface of silicon chip and a wiring part on a lead frame was inspected (failure attributed to adhesive squeeze-out, curl-up and bleeding, and yield). The aluminum pad was positioned 100 $\mu$m apart from an end face of the silicon chip, while the wire bonding part of wiring was positioned 500 $\mu$m apart from an end face of silicon chip.

"(c) Package crack test"

The semiconductor devices obtained in the following Examples and Comparative Examples were sealed under high pressure with the use of a sealant resin (biphenyl epoxy resin). The resin was cured at 175° C. for 6 hr. In this manner, 100 packages for the package crack test were obtained. Each of the packages was allowed to stand still at high temperature in high humidity (85° C., 85% RH) for 168 hr. Thereafter, each package was allowed to stand still for 1 min in the same environment (215° C.) as in VPS (Vapor Phase Soldering), and cooled to room temperature. These were carried out thrice, and any cracking of the sealant resin was inspected by SAT (Scanning Acoustic Tomography). The package cracking ratio is a proportion of the number of cracked packages to the number of inspected packages (namely 100).

The surface protective sheet, dicing tape, dicing/die bond sheet, mounting tape and surface protective tape for back grinding employed in the following Examples and Comparative Examples are as specified below.

(1) The surface protective sheet was prepared in the following manner.

100 parts by weight of a 25% ethyl acetate solution of an acrylic copolymer having a weight average molecular weight of 300,000, prepared from 60 parts by weight of butyl acrylate, 10 parts by weight of methyl methacrylate and 30 parts by weight of 2-hydroxyethyl acrylate, was reacted with 7.0 parts by weight of methacryloyloxyethyl isocyanate to thereby obtain an energy radiation curable copolymer. 0.5 part by weight of polyisocyanate compound (Coronate L, produced by Nippon Polyurethane Co., Ltd.) as a crosslinking agent and 1.0 part by weight of 1-hydroxycyclohexyl phenyl ketone (Irgacure 184, produced by Ciba Specialty Chemicals) as a photopolymerization initiator were mixed with 100 parts by weight, in terms of solid contents, of the energy radiation curable copolymer, thereby obtaining an energy radiation curable pressure sensitive adhesive.

A 110 $\mu$m thick polyethylene film (Young's modulus ×thickness=14.3 kg/cm) was coated with the energy radiation curable pressure sensitive adhesive so that the coating thickness after drying was 20 $\mu$m. Drying was performed at 100° C. for 1 min, thereby obtaining a pressure sensitive adhesive sheet.

(2) Dicing tape:

Adwill D-628 (110 $\mu$m thick polyolefin base and 20 $\mu$m thick energy radiation curable pressure sensitive adhesive layer, produced by LINTEC Corporation).

(3) Dicing/die bond sheet:

Adwill LE 5000 (100 $\mu$m thick polyolefin base and 20 $\mu$m thick thermosetting adhesive layer, produced by LINTEC Corporation), or thermoplastic polyimide sheet (25 $\mu$m thick polyethylene naphthalate base and 20 $\mu$m thick thermoplastic polyimide adhesive layer).

(4) Mounting tape:

Adwill D-650 (110 $\mu$m thick polyolefin base and 20 $\mu$m thick energy radiation curable pressure sensitive adhesive layer, produced by LINTEC Corporation).

(5) Surface protective tape for back grinding:

Adwill E-6142S (110 $\mu$m thick polyolefin base and 30 $\mu$m thick energy radiation curable pressure sensitive adhesive layer, produced by LINTEC Corporation)

Example 1

A silicon wafer of 6 inch diameter and 700 $\mu$m thickness was adhered to the dicing tape (Adwill D-628), and grooves were formed by the use of wafer dicing machine (DAD 2H/6T, manufactured by Disco Corporation) using a 35 $\mu$m width blade under conditions such that the cut depth was 400 $\mu$m and the chip size was 5 mm-square. Subsequently, the surface protective sheet was stuck to the grooved surface of the wafer. The dicing tape was peeled off, and the back of the wafer was ground by means of back grinding machine (DFG 840, manufactured by Disco Corporation) until the wafer thickness became 80 μm to thereby effect division of the wafer into individual chips. Thereafter, the dicing/die bond sheet (Adwill LE5000) was stuck to the ground back of the wafer (chips), and the surface protective sheet was irradiated with ultraviolet light and peeled off. The dicing/die bond sheet was irradiated with ultraviolet light, and the adhesive layer lying between neighboring divided individual silicon chips was cut (diced) by the use of wafer dicing machine (DAD 2H/6T, manufactured by Disco Corporation) using a 30 μm width blade under conditions such that the cut depth was 35 μm. Finally, the divided individual silicon chips were picked up from the dicing/die bond sheet, and the silicon chips having the adhesive layer of the dicing/die bond sheet sticking thereto were directly die bonded to die pad portions of a lead frame. Thermal curing was effected under given curing conditions (160° C. for 30 min). Thus, a semiconductor device was obtained.

The results are given in Table 1.

Example 2

A silicon wafer of 6 inch diameter and 700 μm thickness was adhered to the dicing tape (Adwill D-628), and grooves were formed by the use of wafer dicing machine (DAD 2H/6T, manufactured by Disco Corporation) using a 35 μm width blade under conditions such that the cut depth was 400 μm and the chip size was 5 mm-square. Subsequently, the surface protective sheet was stuck to the grooved surface of the wafer. The dicing tape was peeled off, and the back of the wafer was ground by means of back grinding machine (DFG 840, manufactured by Disco Corporation) until the wafer thickness became 80 μm to thereby effect division of the wafer into individual chips. Thereafter, the dicing/die bond sheet (thermoplastic polyimide sheet) was heated at about 130° C. and stuck to the ground back of the wafer (chips), and the surface protective sheet was peeled off. The adhesive layer lying between neighboring divided individual silicon chips was cut (diced) by the use of wafer dicing machine (DAD 2H/6T, manufactured by Disco Corporation) using a 30 μm width blade under conditions such that the cut depth was 35 μm. Finally, the divided individual silicon chips were picked up from the dicing/die bond sheet, and the silicon chips having the adhesive layer of the dicing/die bond sheet sticking thereto were directly die bonded at 150° C. to die pad portions of a lead frame. Thus, a semiconductor device was obtained.

The results are given in Table 1.

Comparative Example 1

A silicon wafer of 6 inch diameter and 700 μm thickness was adhered to the dicing tape (Adwill D-628), and grooves were formed by the use of wafer dicing machine (DAD 2H/6T, manufactured by Disco Corporation) using a 35 μm width blade under conditions such that the cut depth was 400 μm and the chip size was 5 mm-square. Subsequently, the surface protective sheet was stuck to the grooved surface of the wafer. The dicing tape was peeled off, and the back of the wafer was ground by means of back grinding machine (DFG 840, manufactured by Disco Corporation) until the wafer thickness became 80 μm to thereby effect division of the wafer into individual chips. Thereafter, the mounting tape (Adwill D-650) was stuck to the ground back of the wafer (chips), and the surface protective sheet was peeled off. The individual silicon chips were picked up and bonded to die pad portions, having been coated with a paste adhesive for bonding in advance, of a lead frame. Thermal curing was effected under given curing conditions. Thus, a semiconductor device was obtained.

The results are given in Table 1.

Comparative Example 2

The surface protective tape for back grinding (Adwill E-6142S) was stuck to a silicon wafer of 6 inch diameter and 700 μm thickness, and the back of the wafer was ground by means of back grinding machine (DFG 840, manufactured by Disco Corporation) until the wafer thickness became 80 μm. The surface protective tape for back grinding was peeled off. The dicing/die bond sheet (Adwill LE5000) was adhered to the ground back of the wafer, and irradiated with ultraviolet light. Cutting (dicing) was performed by the use of wafer dicing machine (DAD 2H/6T, manufactured by Disco Corporation) using a 35 μm width blade under conditions such that the cut depth was 115 μm and the chip size was 5 mm-square. The thus obtained silicon chips with adhesive layers were directly die bonded to die pad portions of a lead frame. Thermal curing was effected under given curing conditions (160° C. for 30 min). Thus, a semiconductor device was obtained.

The results are given in Table 1.

TABLE 1

| | Wire bonding test | | Package | Chipping test | |
| --- | --- | --- | --- | --- | --- |
| | wire bonding property | yield (%) | crack test cracking ratio (%) | chip breakage/ cracking | crack width (μm) |
| Example 1 | good | 100 | 0 | none | 0 |
| Example 2 | good | 100 | 0 | none | 0 |
| Comparative Ex. 1 | bad | 30 | 20 | none | 0 |
| Comparative Ex. 2 | good | 100 | 0 | found | 13–20 |

What is claimed is:

1. A process for producing a semiconductor device, comprising the steps of:
    providing a wafer of given thickness having a surface furnished with semiconductor circuits and a back;
    forming grooves of a cut depth smaller than the thickness of the wafer, the grooves extending from the wafer surface;
    sticking a surface protective sheet onto the wafer surface;
    grinding the back of the wafer so that the thickness of the wafer is reduced to a thickness which is equal to or less than the cut depth of the grooves, which results in the division of the wafer into individual chips with spaces therebetween;
    sticking a dicing/die bond sheet onto a ground back of the wafer, the dicing/die bond sheet comprising a base and, superimposed thereon, an adhesive layer, wherein the adhesive layer contacts the ground back of the wafer;
    peeling the surface protective sheet from the wafer surface to thereby cause the adhesive layer of the dicing/die bond sheet to be exposed through each space between neighboring individual chips;
    cutting the exposed adhesive layer of the dicing/die bond sheet using a dicing blade means, whereby the adhesive layer of the dicing/die bond sheet is cut into pieces of substantially a same size and shape as the chips;
    detaching the individual chips having the cut adhesive layer adhering thereto from the base of the dicing/die bond sheet; and
    bonding the individual chips through the adhesive layer to a given substrate.

* * * * *

UNITED STATES PATENT AND TRADEMARK OFFICE
CERTIFICATE OF CORRECTION

PATENT NO. : 6,656,819 B2
DATED : December 2, 2003
INVENTOR(S) : Takashi Sugino et al.

Page 1 of 1

It is certified that error appears in the above-identified patent and that said Letters Patent is hereby corrected as shown below:

Column 2,
Lines 21-23, "In order to overcome the problems of the prior art, to overcome the problems of the prior art, the present invention to provides a process, for" should read -- In order to overcome the problems of the prior art, the present invention provides a process for --.
Line 62, "a device" should read -- a semiconductor device --.

Column 3,
Lines 63-64, "the individual chip and" should read -- now occupied by the individual chips 3 and --.

Signed and Sealed this

Fourth Day of May, 2004

JON W. DUDAS
*Acting Director of the United States Patent and Trademark Office*